(12) United States Patent
Tang et al.

(10) Patent No.: US 8,063,497 B2
(45) Date of Patent: Nov. 22, 2011

(54) LIQUID CRYSTAL DISPLAY

(75) Inventors: Pao-Yun Tang, Tao-Yuan Hsien (TW); Wei-Hao Sun, Taipei (TW)

(73) Assignee: HannStar Display Corp., Wugu Industrial Zone, Taipei County (TW)

( * ) Notice: Subject to any disclaimer, the term of this patent is extended or adjusted under 35 U.S.C. 154(b) by 455 days.

(21) Appl. No.: 12/194,546

(22) Filed: Aug. 20, 2008

(65) Prior Publication Data

US 2009/0268147 A1    Oct. 29, 2009

(30) Foreign Application Priority Data

Apr. 24, 2008  (TW) ................. 97115029 A

(51) Int. Cl.
 H01L 23/52  (2006.01)
 H01L 23/48  (2006.01)
 H01L 29/40  (2006.01)

(52) U.S. Cl. ............. 257/786; 257/E23.021; 257/692; 257/737; 438/612; 438/666

(58) Field of Classification Search ........... 257/E23.023, 257/737, 692, 738, 772, 786, E23.021, E23.065; 349/149, 151, 152; 438/108, 612, 666; 174/250, 174/261

See application file for complete search history.

(56) References Cited

U.S. PATENT DOCUMENTS

| | | | | |
|---|---|---|---|---|
| 5,608,559 A * | 3/1997 | Inada et al. | ................ | 349/149 |
| 6,052,170 A * | 4/2000 | Kobayashi | ................ | 349/149 |
| 6,297,868 B1 * | 10/2001 | Takenaka et al. | ........... | 349/151 |
| 6,329,969 B1 * | 12/2001 | Yano | ................ | 345/87 |
| 6,583,844 B1 * | 6/2003 | Mishima et al. | ............ | 349/149 |
| 6,603,071 B2 * | 8/2003 | Takao | ................ | 174/538 |
| 6,867,490 B2 * | 3/2005 | Toyosawa | ................ | 257/692 |
| 7,068,340 B2 * | 6/2006 | Yamate et al. | ............... | 349/152 |
| 7,144,758 B2 * | 12/2006 | Yuzawa | ................ | 438/108 |
| 7,224,424 B2 * | 5/2007 | Hwang et al. | ............... | 349/152 |
| 7,268,416 B2 * | 9/2007 | Furihata | ................ | 257/678 |
| 7,449,787 B2 * | 11/2008 | Yamate et al. | ............... | 257/786 |
| 7,486,284 B2 * | 2/2009 | Hwang et al. | ................ | 345/204 |
| 7,535,522 B2 * | 5/2009 | Watanabe et al. | ............ | 349/54 |
| 2002/0018169 A1 * | 2/2002 | Kato | ................ | 349/149 |
| 2004/0108594 A1 * | 6/2004 | Toyosawa | ................ | 257/734 |
| 2007/0216822 A1 * | 9/2007 | Ishige et al. | ................ | 349/39 |

* cited by examiner

*Primary Examiner* — Chris Chu
(74) *Attorney, Agent, or Firm* — Winston Hsu; Scott Margo

(57) ABSTRACT

A chip having a bump layout suitable for the chip on glass technology and a driving IC includes a plurality of first bumps and a plurality of second bumps for electrically connecting to a glass substrate of a displayer. The first and second bumps are disposed on a surface of the chip and near two opposite long sides of the chip respectively. The ratio of the total contacting area of the first bumps to that of the second bumps is between 0.8 and 1.2. Thus, a pressure applied on the chip and the glass substrate of the displayer for connection can be uniformly exerted all over the chip, and the stability of the connection is therefore improved.

20 Claims, 13 Drawing Sheets

LIQUID CRYSTAL DISPLAY

BACKGROUND OF THE INVENTION

1. Field of the Invention

The present invention relates to a chip having a driving integrated circuit, and especially a chip suitable for chip on glass (COG) technology.

2. Description of the Prior Art

In COG packing techniques, a driving chip is directly disposed on a glass substrate of a display device to output a needed voltage or a signal to pixels of the display device. Accordingly, the driving chip can control the direction of liquid crystal molecules, and can therefore control the displayed colors in each pixel of the display device. The driving chip can also be called a driving integrated circuit (driving IC), since the driving chip usually uses an integrated circuit therein for working. In a COG process, the driving chip and the bottom glass substrate of the display device are directly connected by an anisotropic conductive film (ACF) or a non-conductive film (NCF), so that input/output bumps of the driving chip can be electrically connected to the metal traces of the bottom glass substrate.

ACF generally consists of non-conductive glue and conductive particles mixed in the non-conductive glue. ACF can affix the driving chip to the glass substrate, and also fill gaps formed between the bumps and the metal traces for adhering, supporting and electrically connecting the driving chip and the bottom glass substrate. However, the cost of the display device fabricated by ACF process cannot be effectively decreased, due to the large expense of the conductive particles. If NCF is directly adopted to connect most kinds of drive chips and the glass substrate of the display device, bad indentations occur in the bumps of the driving chip, leading to a poor electronic connection and even a poor display image of the display device. This is because the NCF is not electrically conductive, so the NCF is unsuitable for filling the gaps formed between the bumps and the metal traces, and it is best that there are no gaps between the bumps and the metal traces. As a result, the NCF process cannot be applied to all kinds of drive chips.

SUMMARY OF THE INVENTION

Therefore, an objective of the present invention is to provide a bump layout of a driving chip to solve the above-mentioned problem of bad indentations occurring in the bumps of the driving chip.

To achieve the aforementioned objective, the present invention provides a chip having a driving integrated circuit, where the chip includes a plurality of first bumps and a plurality of second bumps. The first bumps and the second bumps are connected to an external device. The chip has a surface with a first edge and a second edge opposite to the first edge. The first bumps are disposed on the surface of the chip and near the first edge. Each of the first bumps has at least one first contacting area for being connected to the external device. The second bumps are disposed on the surface of the chip and near the second edge. Each of the second bumps has at least one second contacting area for being connected to the external device. A ratio of a sum of the first contacting areas to a sum of the second contacting areas is between 0.8 and 1.2, while a ratio of each of the second contacting areas to each of the first contacting areas is between 0.25 and 0.5.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a driving chip of a display device suitable for the COG packing technique, where the total area of the bumps disposed near one edge of the driving chip is approximately equal to the total area of the bumps disposed near the opposite edge. For example, a ratio of the total contacting area of the bumps near the upper edge to the total contacting area of the bumps near the lower edge is between 0.8 and 1.2. Accordingly, the present invention can solve the problem of bad indentations occurring in the bumps of the driving chip. The bump layout of the present invention can be applied to any device having an integrated circuit, and especially to the driving chip of a liquid crystal display, such as a source driving chip (also called a source driving IC) disposed in the X-axial, or a gate driving chip (also called a gate driving IC) disposed in the Y-axial.

Figure 1:
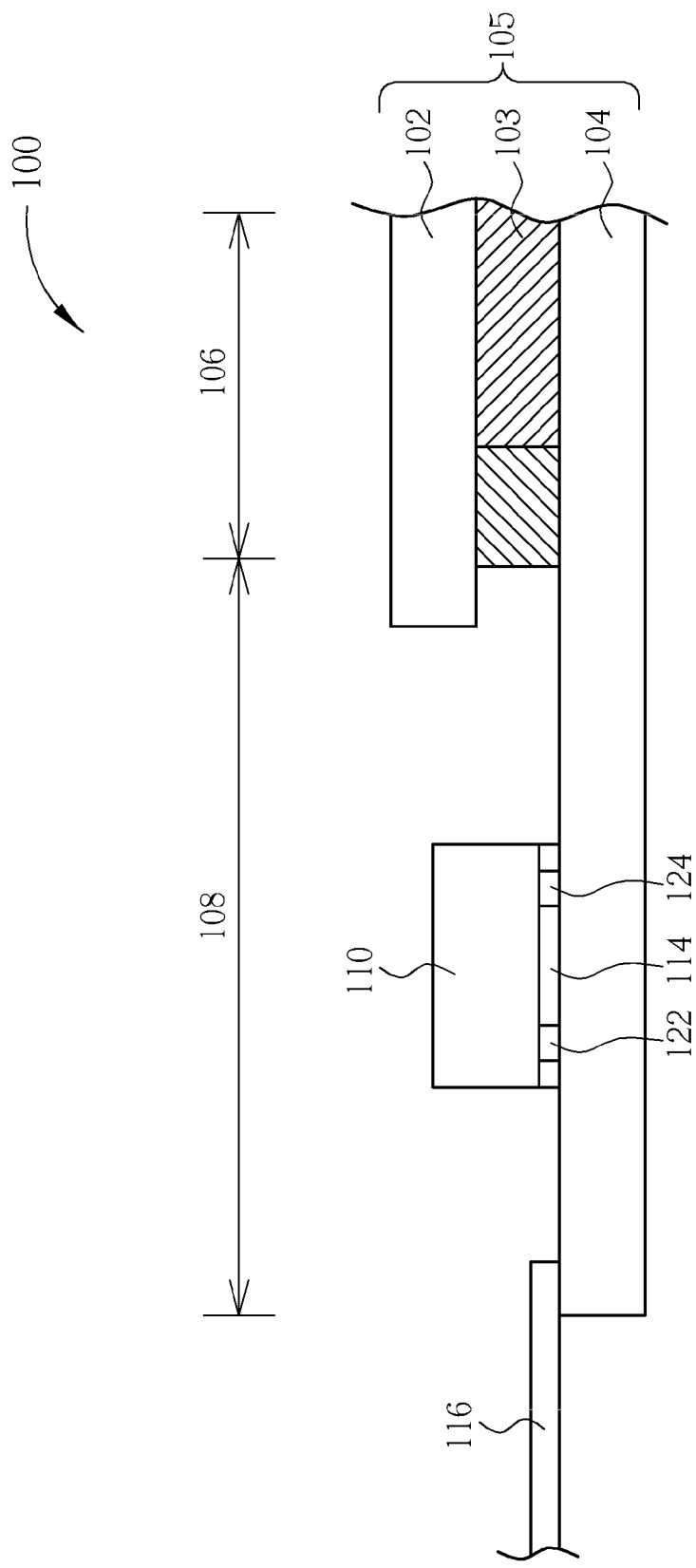
FIG. 1 is a schematic cross-sectional diagram illustrating a liquid crystal display in accordance with the first preferred embodiment of the present invention.
Figure 2:
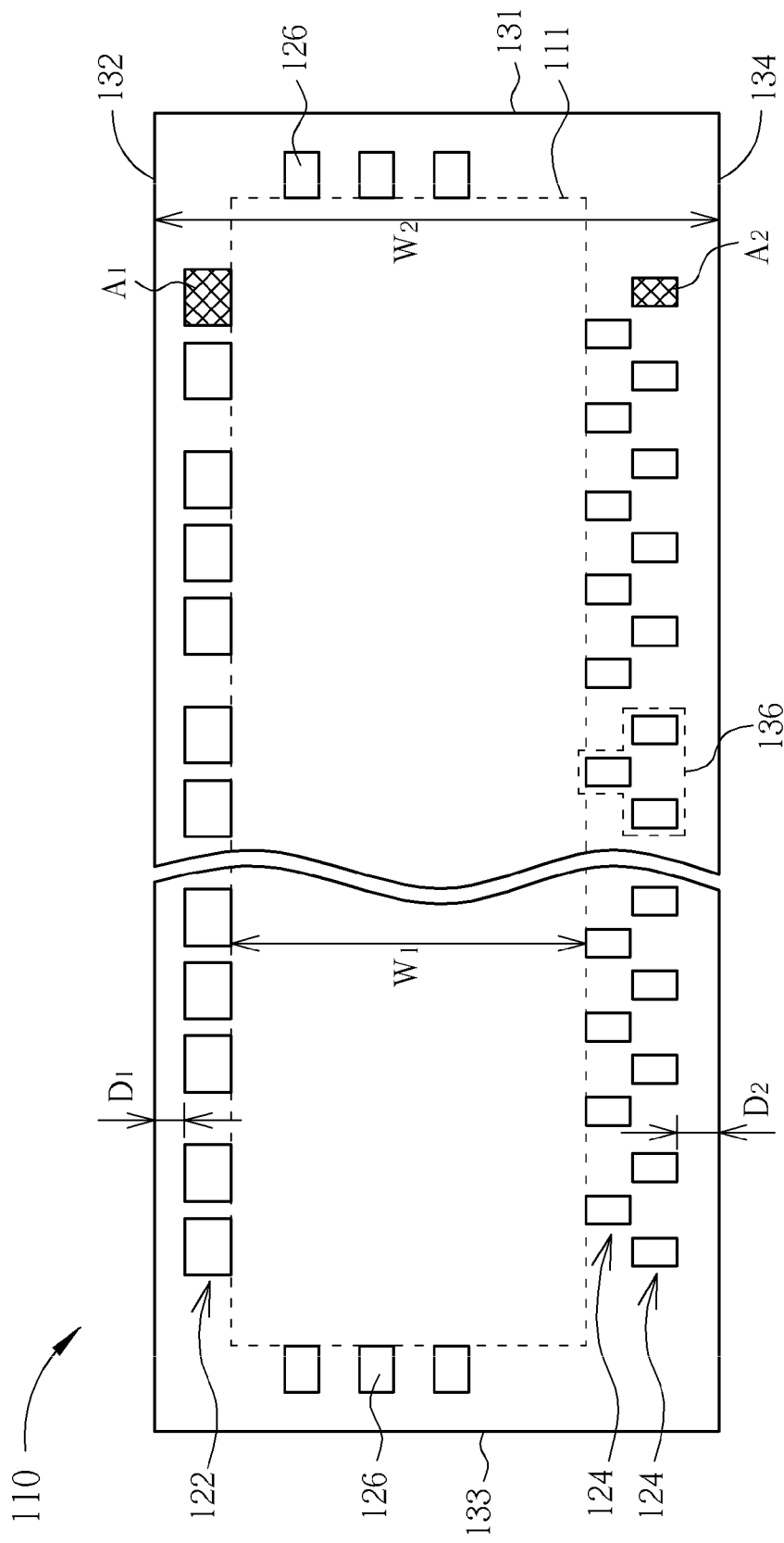
FIG. 2 is a schematic bottom-view diagram illustrating a chip having a driving IC in accordance with the first preferred embodiment of the present invention.

FIG. 1 is a schematic cross-sectional diagram illustrating a liquid crystal display 100 in accordance with the first preferred embodiment of the present invention, and FIG. 2 is a schematic bottom-view diagram illustrating the chip 110 having a driving IC in accordance with the first preferred embodiment of the present invention, where like numbered numerals designate similar or the same parts, regions or elements. It is to be understood that the drawings are not drawn to real scale and serve only for illustration purposes. As shown in FIG. 1, the liquid crystal display 100 includes two glass substrates 102 and 104 arranged in parallel, where the glass substrate 102 is a color filter substrate (for example), and the glass substrate 104 is a thin film transistor substrate. The glass substrates 102, 104 and a liquid crystal layer 103 disposed between the glass substrates 102, 104 constitute a liquid crystal display panel 105. The liquid crystal display 100 can be divided into two areas: a display region 106 and a peripheral region 108. At least one chip having a driving IC (which can also be called a driving chip in the following description) 110, such as a source driving chip or a gate driving chip, can be included on the peripheral region 108 of the glass substrate 104. The driving chip 110 can be adhered to the glass substrate 104 by a non-conductive film 114, while first bumps 122 and second bumps 124 can therefore be connected to metal traces (not shown in the drawings) of the glass substrate 104. At least one flexible printed circuit board 116 is mounted on the peripheral region 108 for transferring control signals. When the driving chip 110 is a gate-driving chip, it can transmit signals to scan lines via a plurality of output terminals (not shown). When the driving chip 110 is a source-driving chip, it can transmit signals to data lines via a plurality of output terminals (not shown).

As shown in FIG. 2, the driving chip 110 can include a plurality of first bumps 122, a plurality of second bumps 124 and a plurality of side bumps 126 disposed on a surface of the driving chip 110 for electrically connecting to metal traces of the liquid crystal display 100 (not shown in FIG. 2). The first bumps 122 can usually be input bumps of the driving chip 110, while the second bumps 124 can be output bumps of the driving chip 110, but should not be limited to these examples. In a top view, the surface of the driving chip 110 can be substantially a rectangular surface having two pairs of opposite edges. The two longer edges of the rectangular surface, which are opposite to each other, can be defined as a first edge 132 and a second edge 134. The first edge 132 and the second edge 134 are longer than the other two opposite edges 131, 133 of the driving chip 110. The first bumps 122 and the second bumps 124 are disposed near the first edge 132 and the second edge 134, respectively. Specifically speaking, the term "near" used in the present invention describes a distance D1 between the first bumps 122 and the first edge 132 between 0.8 micrometers and 0.15 micrometers, and a distance D2 between the second bumps 124 and the second edge 134 between 0.8 micrometers and 0.15 micrometers. According to the above-mentioned arrangement, the driving chip 110 can include a central region 111 on its surface. The central region 111 is bounded by the first bumps 122, the second bumps 124 and the side bumps 126, and the central region 111 has no function bumps in the present invention. In other words, a minimum distance between the first bumps 122 and the second bumps 124 is the width W1 of the central region 111. The width W1 of the central region 111 is preferably between 80 percent and 90 percent of the width W2 of the driving chip 110, while the width W2 is a distance between the first edge 132 and the second edge 134. It should be noted that the input/output terminals (or input/output bumps) of the driving chip 110 are mainly disposed near the opposite longer edges of the driving chip 110 to maintain the reliability of manufacturing process, to reserve proper spaces for cutting, and to increase the available space for inner circuits in the driving chip 110. The arrangement of the input/output bumps or the arrangement of the input/output terminals should not be limited to the driving chip 110 in the present invention, however.

Each of the first bumps 122 has a contacting area A1 for connecting or contacting with the circuit of the glass substrate 104, while each of the second bumps 124 has a contacting area A2 for connecting or contacting. A ratio of the total contacting areas A1 of the first bumps 122 to the total contacting areas A2 of the second bumps 124 is in a range from approximately 0.8~1.2, where the preferred ratio is 1 in the present invention. Accordingly, stresses resulting from the connection between the driving chip 110 and the display device can be distributed evenly in all positions of the driving chip 110, so the reliability and stability of the driving chip 110 can thereby be increased. In this embodiment, the first bumps 122 can be arranged in a row along the direction of the first edge 132, and the second bumps 124 can be arranged in two rows along the direction of the second edge 134. The second bumps 124 can be staggered in the rows. In other words, every three second bumps 124 can form a triangular pattern 136, while the second bumps 124 are arranged as apexes of the triangular pattern 136. Because the second bumps 124 are more numerous than the first bumps 122 in this embodiment, the contacting area A1 of each first bump 122 can be larger than the contacting area A2 of each second bump 124. Therefore, the total contacting areas A1 of the first bumps 122 can approximate to or be equal to the total contacting areas A2 of the second bumps 124, and the contacting stress between the first bumps 122 and the glass substrate 104, and the contacting stress between the second bumps 124 and the glass substrate 104 can be evenly distributed. For instance, a ratio of the contacting area A2 of a second bump 124 to the contacting area A1 of a first bump 122 is preferably in an approximate range 0.2~0.5, so that the total contacting areas A1 can approximate to or be equal to the total contacting areas A2 for most driving chips. Thus, when the driving chip 110 is adhered to the glass substrate 104 of the display device 100 by the non-conductive film 114 (as shown in FIG. 1), the contacting stress between the first bumps 122 and the glass substrate 104, and the contacting stress between the second bumps 124 and the glass substrate 104 can achieve a better distribution.

In the present invention, the driving chip 110 can also be connected to the glass substrate 104 by a multiple-film layer. For example, a multiple-film layer including a non-conductive film and an anisotropic conductive film can be applied to connect the driving chip 110 and the glass substrate 104. However, since a uniform distribution of bumps are achieved in the present invention, it is preferred to use one non-conductive film 114 to directly connect the driving chip 110 and the glass substrate 104 without the anisotropic conductive film, in order to decrease the cost.

It is eventually shown from many experiments, tests and research regarding the present invention that the preferred ratio of the total contacting areas A1 of the first bumps 122 to the total contacting areas A2 of the second bumps 124 is in an approximate range of 0.8~1.2, and preferably 1. In such a case, the reliability and stability of the driving chip 110 can be increased, and a greater flexibility in design is provided for inner circuits in the driving chip 110. On other hand, from many experiments and tests regarding the area for the single bump, a preferred ratio of the first contacting area A1 to the second contacting area A2 is between 0.25 and 0.5 to provide an optimum stability, while the needed output bumps (second bumps 124) of the driving chip 110 are usually more than the needed input bumps (first bumps 122) of the driving chip 110 for a liquid crystal display. It should be understood that the preferred ratio of each of the second contacting areas A2 to each of the first contacting areas A1 (such as 0.25 and 0.5) is not only a balance for achieving the preferred ratio of the total contacting areas A1 to the total contacting areas A2 (such as 0.8~1.2), but a preferred design rule for the optimum stability.

Figure 3:
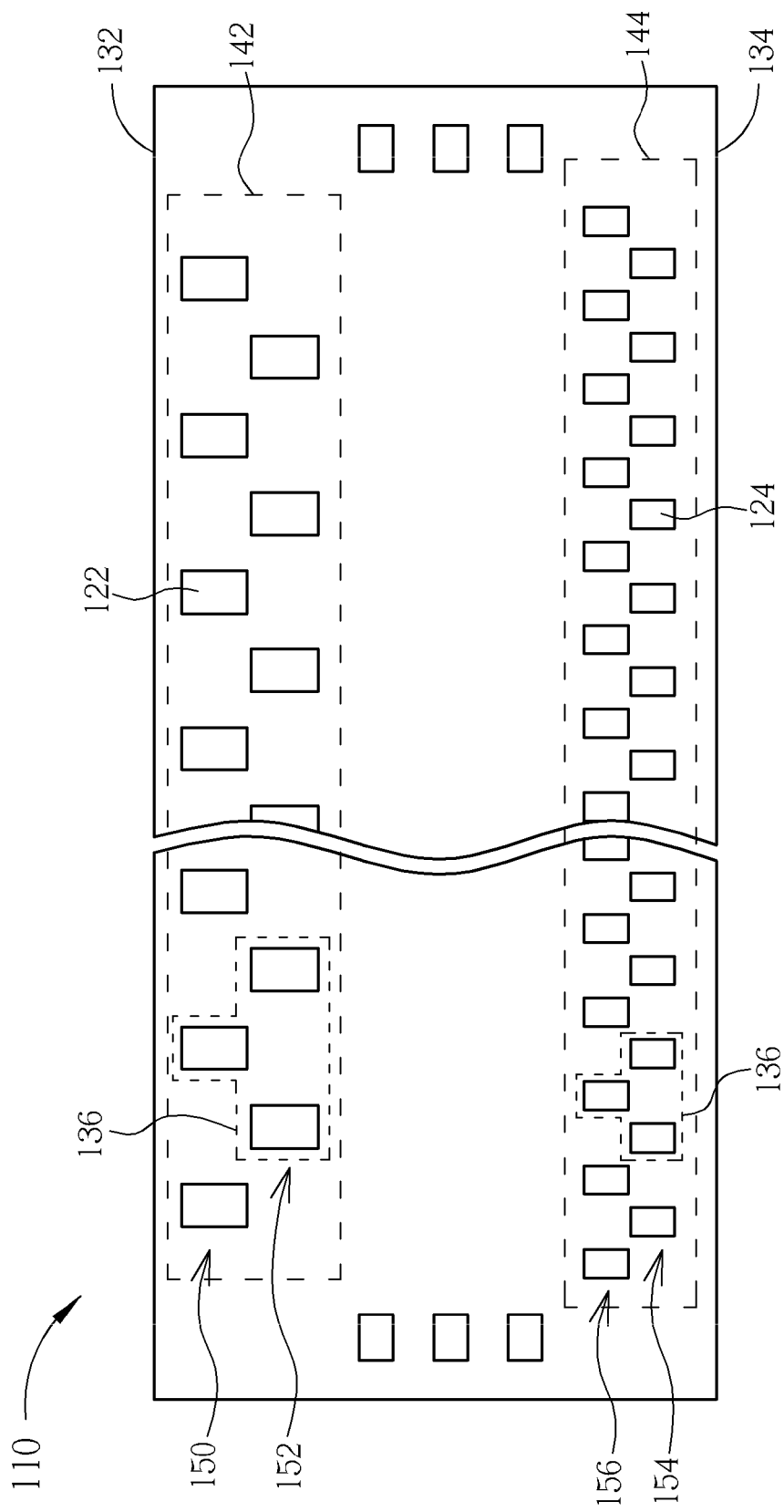
FIG. 3 through FIG. 13 are schematic bottom-view diagrams illustrating chips having driving ICs in accordance with the second to the twelfth preferred embodiments of the present invention.
Figure 4:
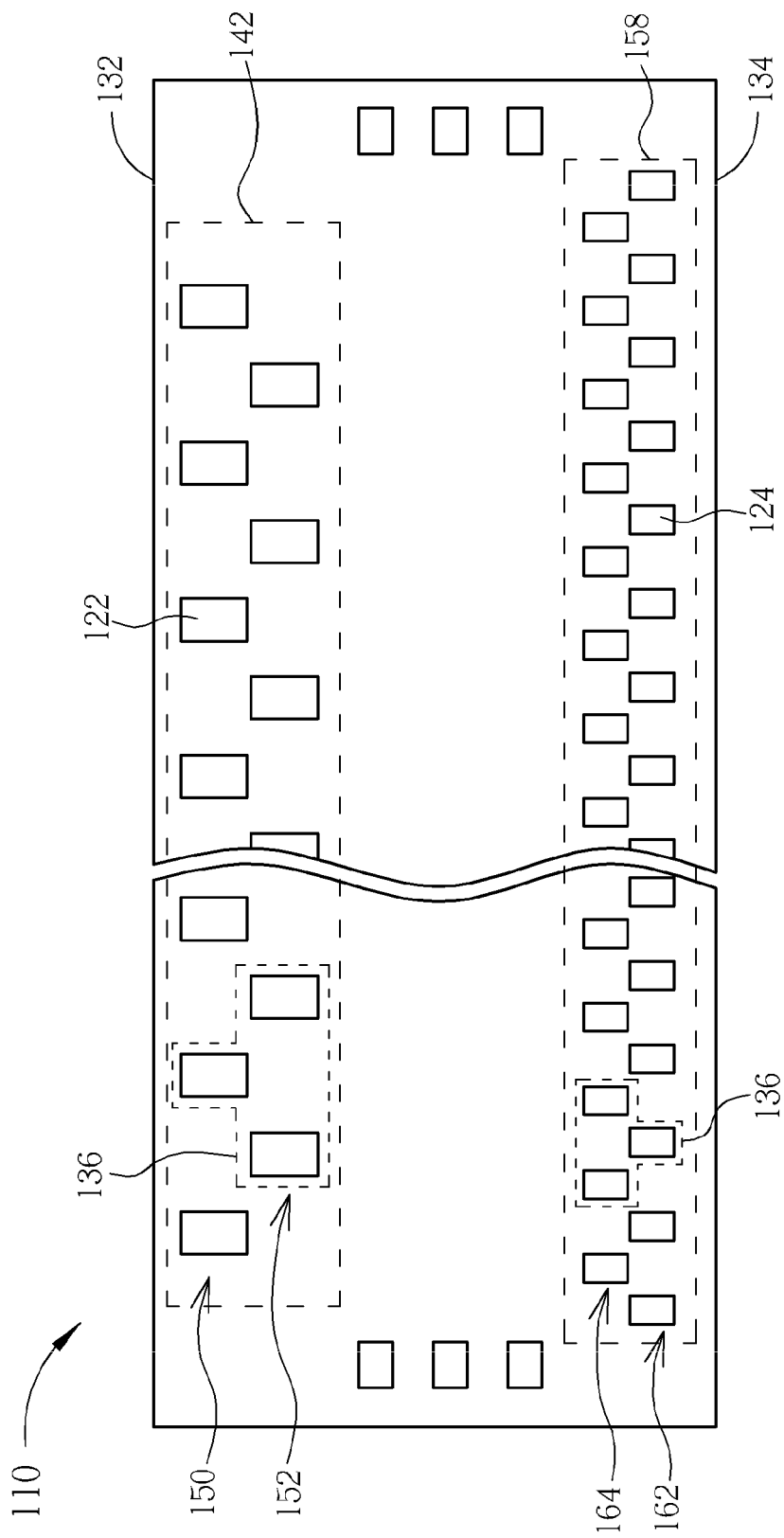
Figure 5:
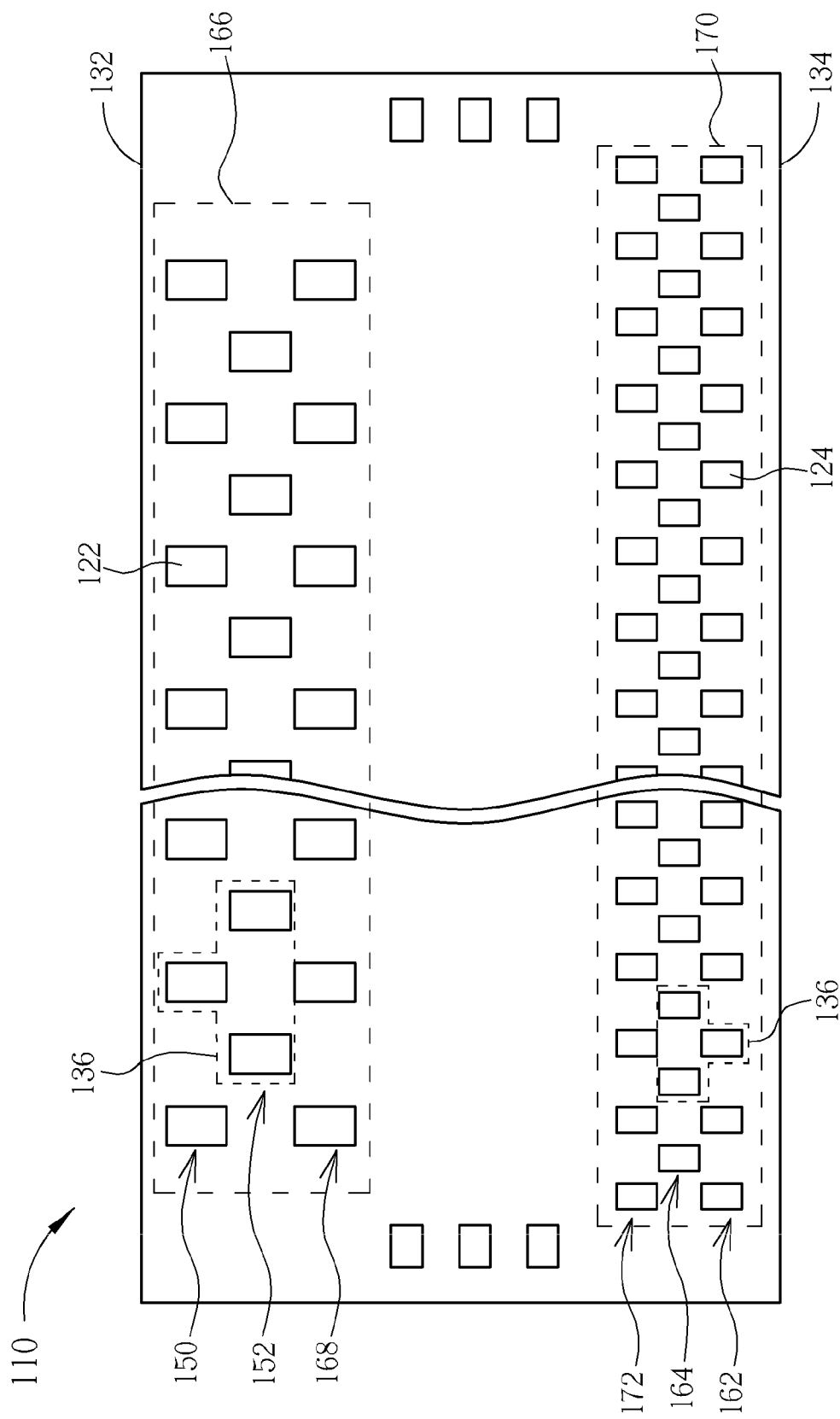

In addition to the ratio of bump areas, the present invention further considers the symmetry of the bump arrangement to increase the stability of connection. FIG. 3 through FIG. 13 are schematic bottom-view diagrams illustrating chips 110 having driving ICs in accordance with the second to the twelfth preferred embodiments of the present invention. Each of the driving chips also includes a central region, having no function bumps on its surface, in the second to twelfth preferred embodiments. The central regions are omitted in the drawings in order to show the bump arrangement clearly. As shown in FIG. 3 and FIG. 4, in the second and third preferred embodiments, the first bumps 122 can be arranged in a row along the direction of the first edge 132, and the second bumps 124 can be arranged in two rows along the direction of the second edge 134. The second bumps 124 can be staggered in the rows. In other words, every three second bumps 124 can form a triangular pattern 136. As shown in FIG. 3, the rows of the first pattern 142 include a first row pattern 150 adjacent to the first edge 132, and a second row pattern 152 adjacent to the first row pattern 150. The first bumps 122 forming the first row pattern 150 are more numerous than the first bumps 122 forming the second row pattern 152. The rows of the second pattern 144 also include a first row pattern 154 adjacent to the second edge 134, and a second row pattern 156 adjacent to the first row pattern 154. The second bumps 124 forming the first row pattern 154 are fewer than the second bumps 124 forming the second row pattern 156. Referring to FIG. 4, the main difference between FIG. 3 and FIG. 4 is that the second bumps 124 forming the first row pattern 162 are more numerous than the second bumps 124 forming the second row pattern 164 in the second pattern 158 of the third embodiment.

It should be noted that, although the second and third embodiments take the staggered arrangement with two rows an example, the present invention should not be limited to the above-mentioned embodiments. The bump pattern of the present invention can include staggered bumps arranged in three rows. Please refer to FIG. 5. The first bumps 122 have a staggered arrangement in three rows in the fourth embodiment, while the second bumps 124 also have a staggered arrangement in three rows. One of the main differences between the third embodiment and the fourth embodiment is that the first pattern 166, which is formed by the first bumps 122, further includes a third row pattern 168 adjacent to the second row pattern 152 in the fourth embodiment, and that the second pattern 170, which is formed by the second bumps 124, further includes a third row pattern 172 adjacent to the second row pattern 164. The number of the first bumps 122 forming the third row pattern 168 can be similar or equal to the number of the first bumps 122 forming the first row pattern 150, and can be more than the number of the first bumps 122 forming the second row pattern 152; and the number of the second bumps 124 forming the third row pattern 172 can be similar or equal to the number of the second bumps 124 forming the first row pattern 162, and can be more than the number of the second bumps 124 forming the second row pattern 164.

Figure 6:
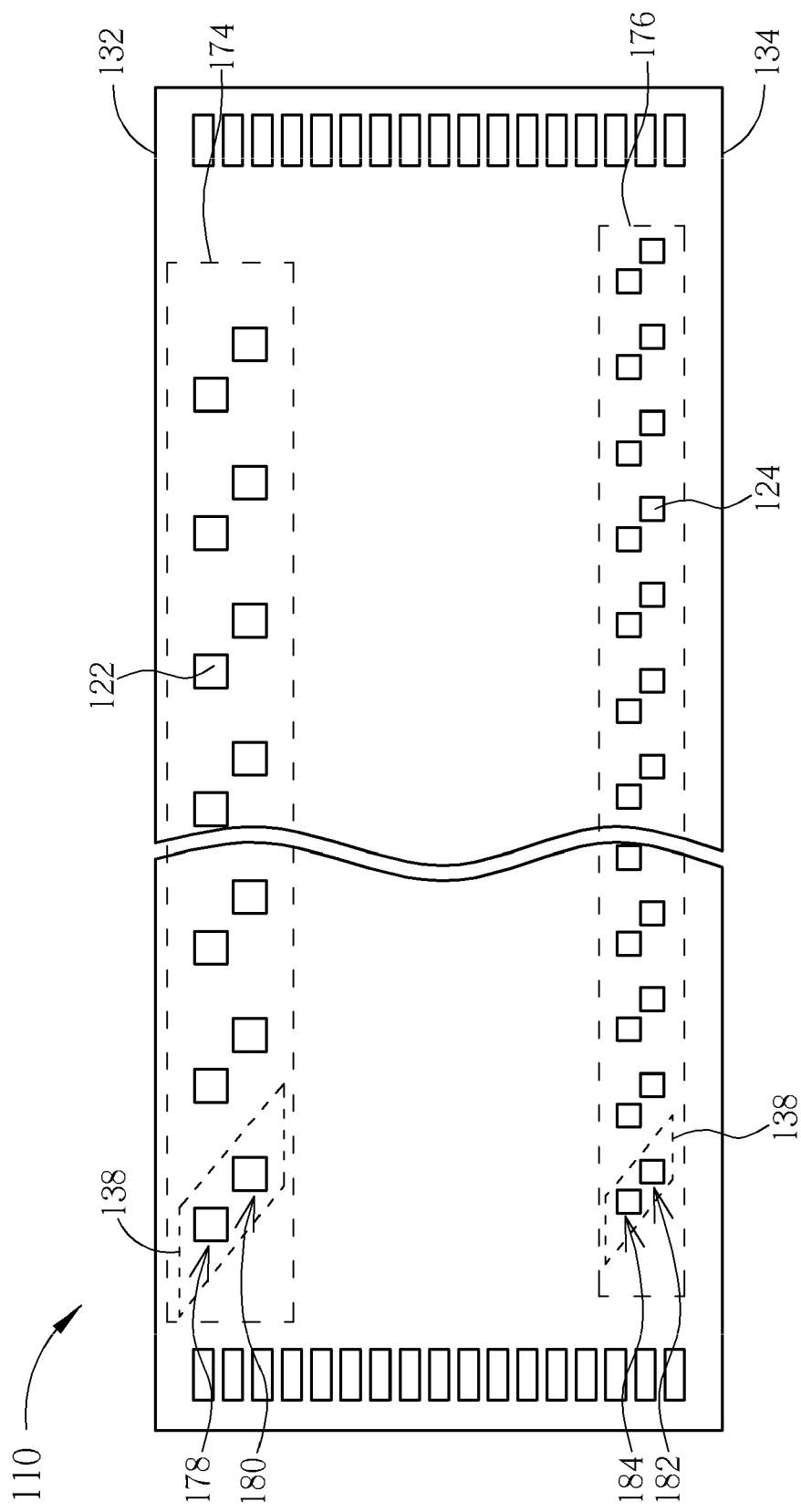
Figure 7:
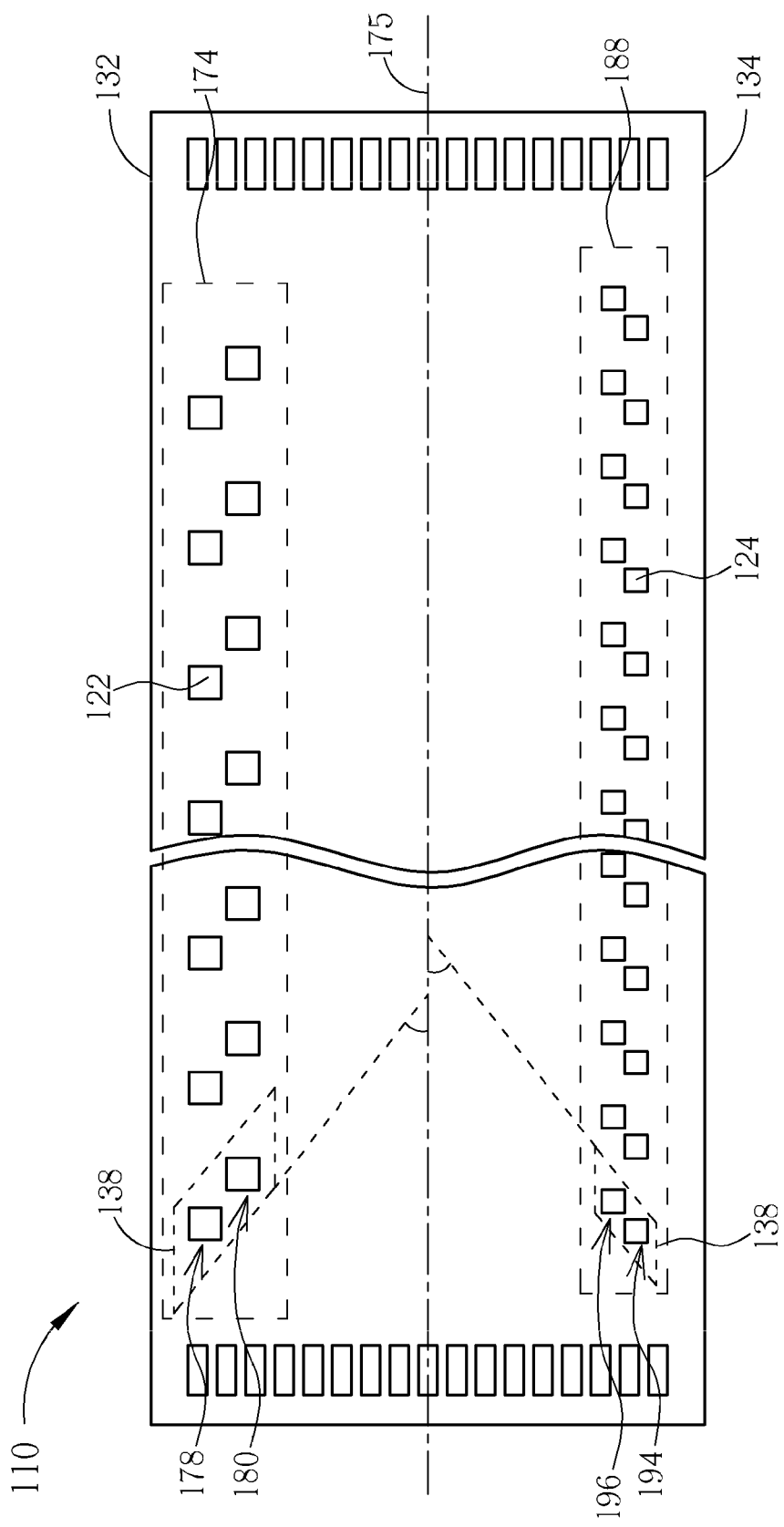

The number of bumps is different from the number of bumps disposed in the adjacent row in the above staggered arrangements. However, the number of bumps can be equal to the number of bumps disposed in the adjacent row in other embodiments. As shown in FIG. 6 and FIG. 7, the first bumps 122 can be arranged as a first pattern 174 consisting of a plurality of oblique lines 138, and the second bumps 124 can be arranged as a second pattern 176 consisting of a plurality of oblique lines 138. The oblique directions of the oblique lines are neither parallel to nor perpendicular to the first edge 132 or the second edge 134. The included angle between the oblique line 138 and the first edge 132 or between the oblique line 138 and the second edge 134 can be in a range between 60~30 degrees, and preferably between 45~30 degrees. In FIG. 6, The first pattern 174 consisting of the first bumps 122 can be arranged along the same direction with the second pattern 176 consisting of the second bumps 124. Specifically speaking, the oblique lines 138 of the first pattern 174 are parallel with the oblique lines 138 of the second pattern 176. The rows of the first pattern 174 can include a first row pattern 178 adjacent to the first edge 132, and a second row pattern 180 adjacent to the first row pattern 178. The first bumps 122 forming the first row pattern 178 are equal to the first bumps 122 forming the second row pattern 180. The rows of the second pattern 176 also include a first row pattern 182 adjacent to the second edge 134, and a second row pattern 184 adjacent to the first row pattern 182. The second bumps 124 forming the first row pattern 182 are equal to the second bumps 124 forming the second row pattern 184.

Please refer to FIG. 7. The first pattern 174 consisting of the first bumps 122 and the second pattern 188 consisting of the second bumps 124 can be symmetrical. Specifically speaking, the oblique lines 138 of the first pattern 174 are symmetrical to the oblique lines 138 of the second pattern 188 with respect to a centerline 175 of the driving chip 110, while the centerline 175 is disposed in the middle of the two shorter opposite edges of the driving chip 110. The included angle between the oblique line 138 and the centerline 175 can be in a range between 60~30 degrees, and preferably between 45~30 degrees. The rows of the first pattern 174 can include a first row pattern 178 adjacent to the first edge 132, and a second row pattern 180 adjacent to the first row pattern 178. The first bumps 122 forming the first row pattern 178 are equal to the first bumps 122 forming the second row pattern 180. The rows of the second pattern 188 also include a first row pattern 194 adjacent to the second edge 134, and a second row pattern 196 adjacent to the first row pattern 194. The second bumps 124 forming the first row pattern 194 are equal to the second bumps 124 forming the second row pattern 196.

Figure 8:
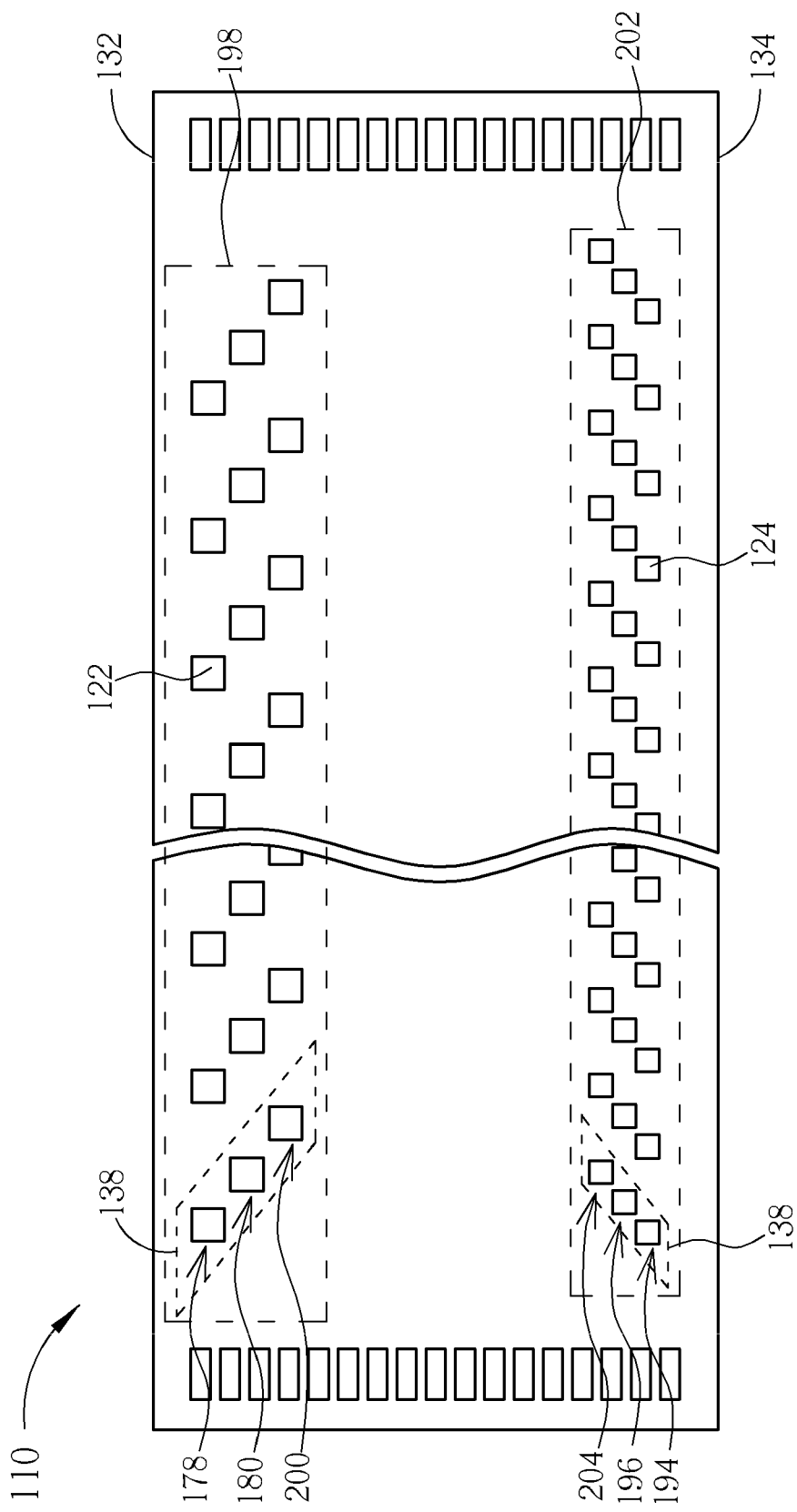

The oblique lines 138 in the fifth and sixth embodiments can also form a bump pattern having three rows, such as shown in FIG. 8. One of the main differences between the sixth embodiment and the seventh embodiment is that the first pattern 198, which is formed by the first bumps 122, further includes a third row pattern 200 adjacent to the second row pattern 180 in the seventh embodiment, and that the second pattern 202, which is formed by the second bumps 124, further includes a third row pattern 204 adjacent to the second row pattern 196. The number of the first bumps 122 forming the third row pattern 200 can be equal to the number of the first bumps 122 forming the first row pattern 178; and the number of the second bumps 124 forming the third row pattern 204 can be equal to the number of the second bumps 124 forming the first row pattern 194.

Figure 9:
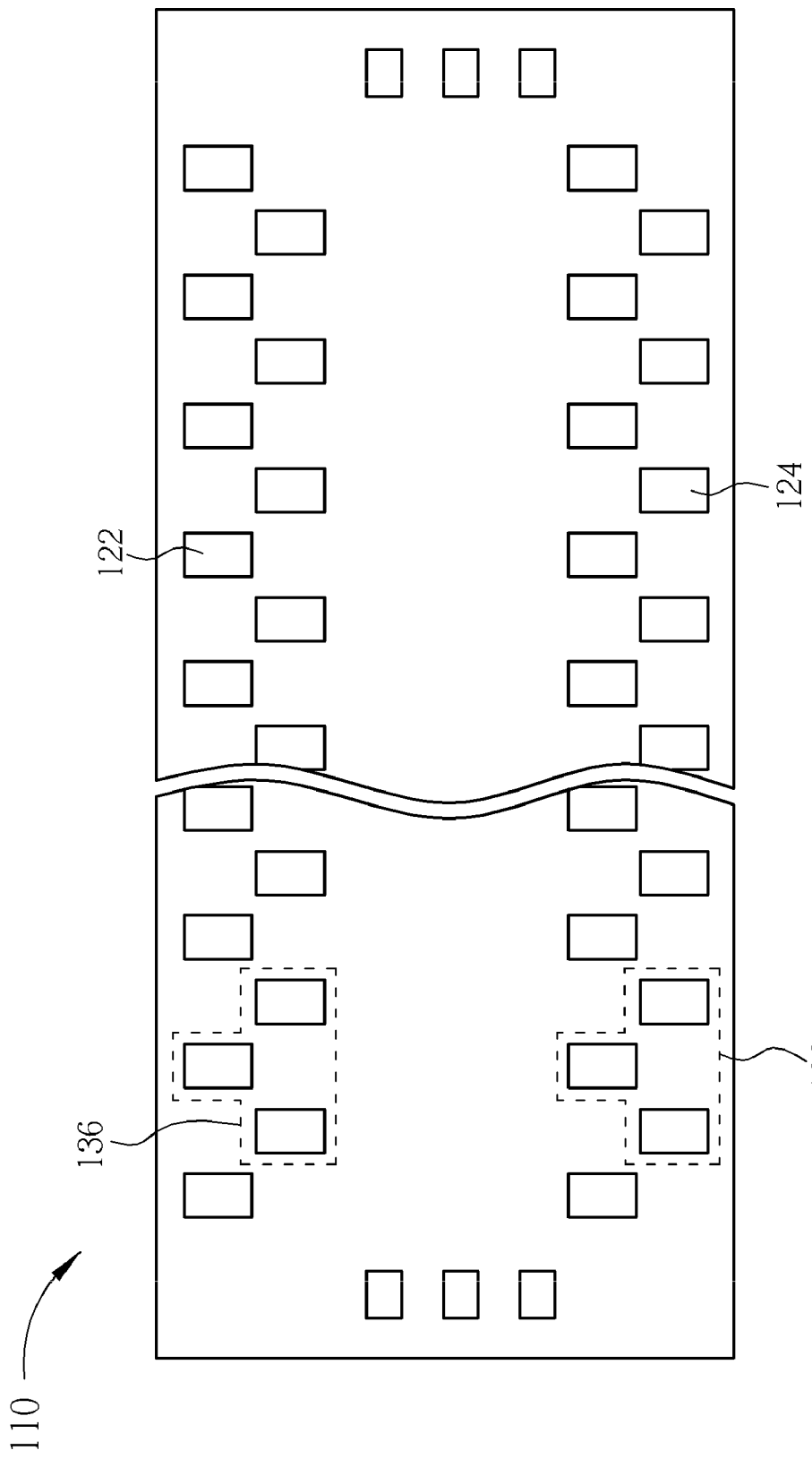
Figure 10:
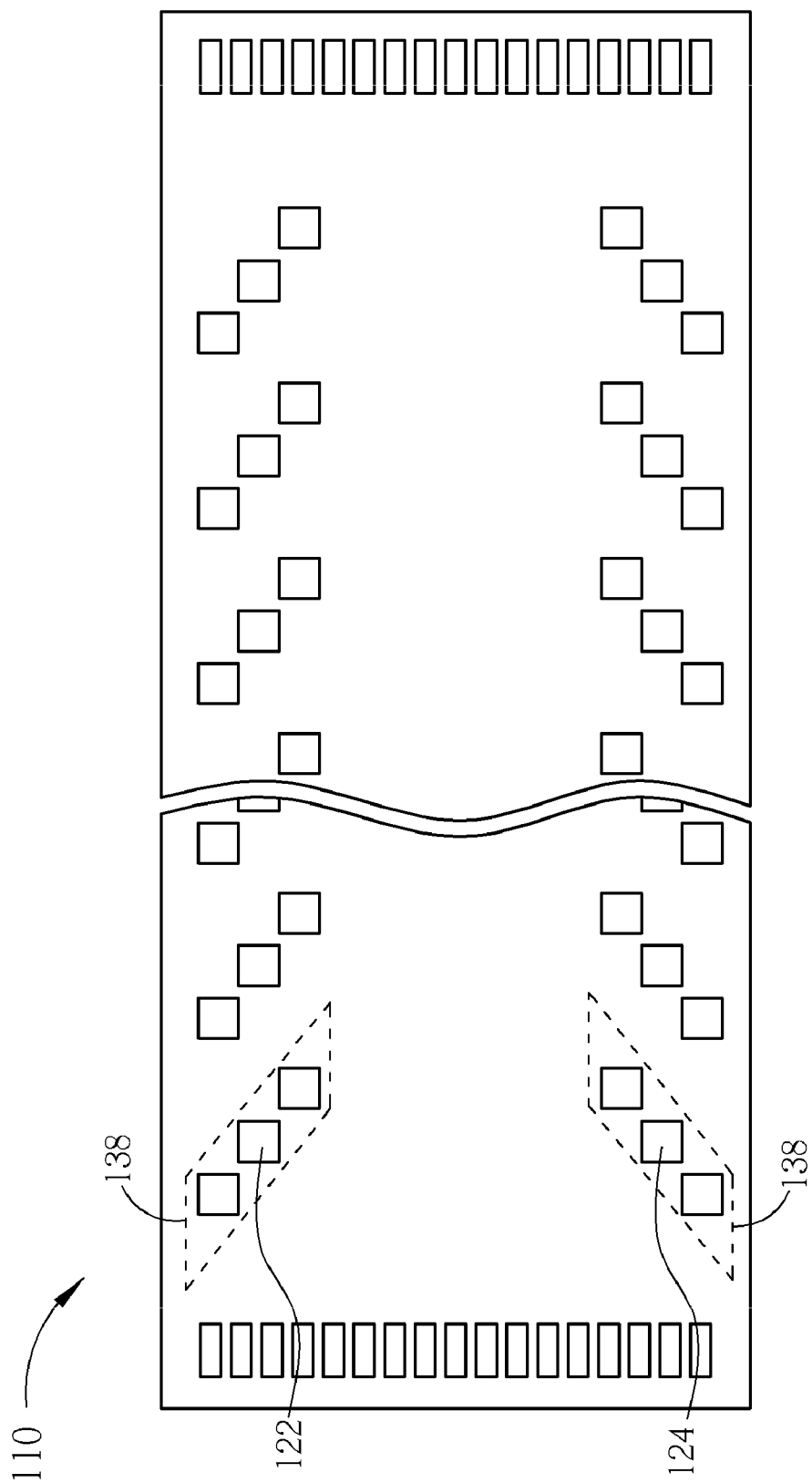

The number of the first bumps 122 and the number of the second bumps 124 are different on the driving chip 110 in the above-mentioned embodiments, so the contact areas and the arrangement of the bumps are adjusted in the present invention to make the contact areas of the first bumps 122 and the second bumps 124 be uniformly distributed over the driving chip 110. Preferably, a ratio of the total contacting areas A1 of the first bumps 122 to the total contacting areas A2 of the second bumps 124 is in an approximate range of 0.8~1.2, and a ratio of the second contacting area A2 of the single second bump 124 to the first contacting area A1 of the single first bump 122 is between 0.25 and 0.5. However, the number of the first bumps 122 can be equal to the number of the second bumps 124 in other embodiments, and the first contacting area A1 of the single first bump 122 can be equal to the second contacting area A2 of the single second bump 124 to provide a more uniform bump distribution, as shown in FIG. 9 and FIG. 10, no matter whether the first bumps 122 and the second bumps 124 are arranged in a row along the direction of the chip edge, are in a staggered arrangement forming triangular patterns 136, or are arranged as a plurality of oblique lines 138.

Figure 11:
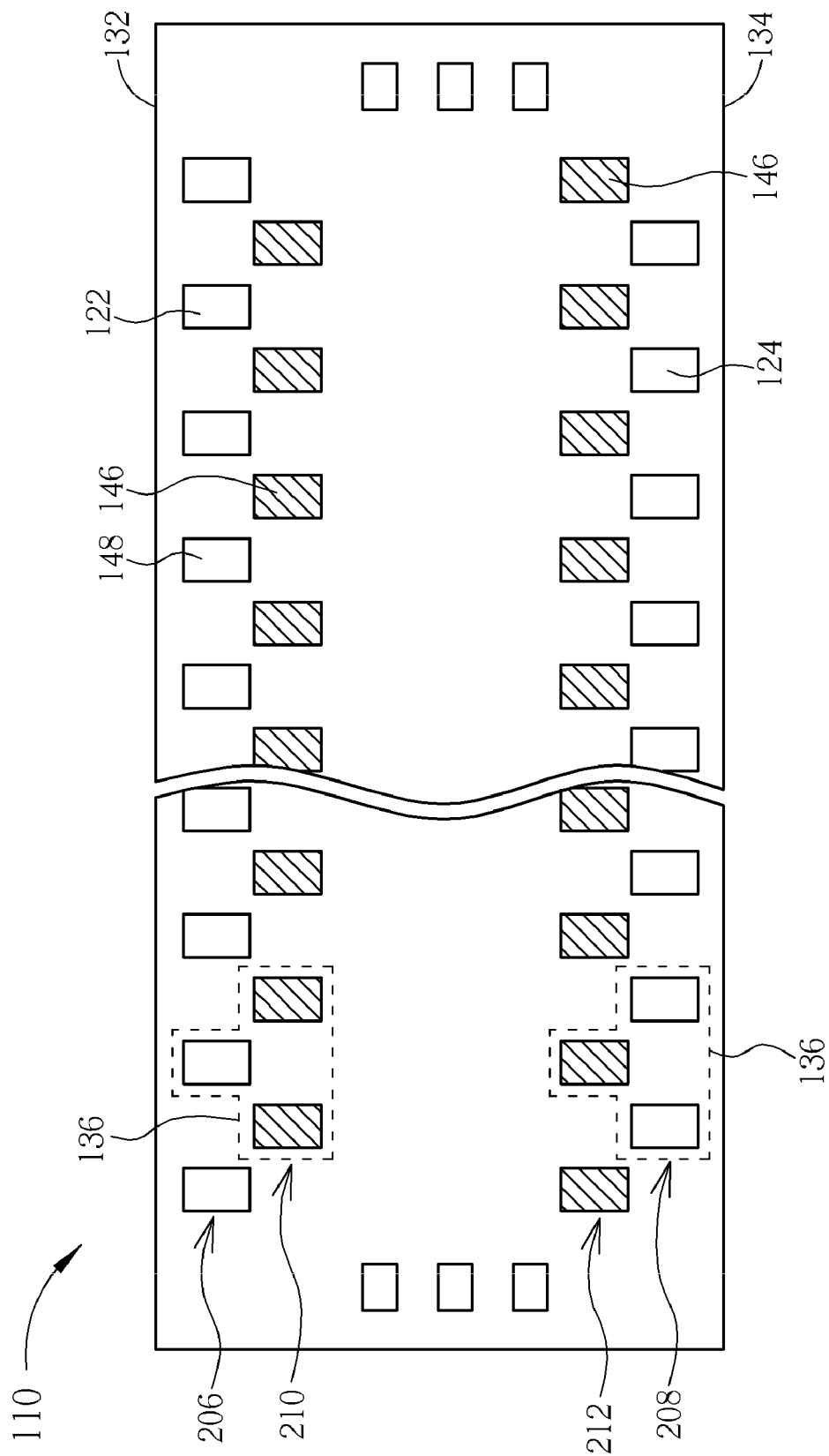
Figure 12:
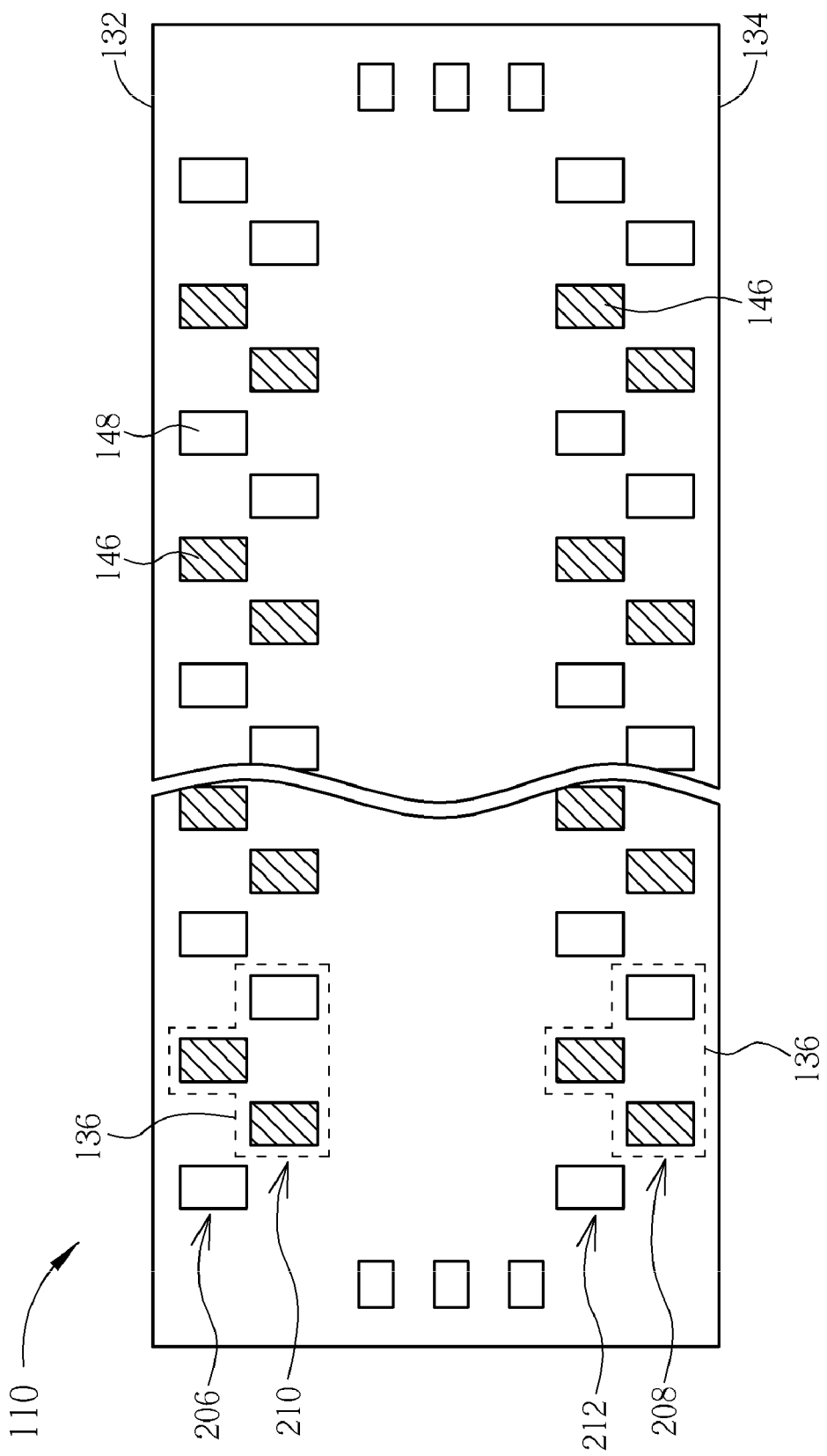

It should be noted that both the preferred ratio of the first contacting area A1 to the second contacting area A2, and the preferred ratio of the total contacting areas A1 to the total contacting areas A2, are design rules of the present invention for achieving the optimum stability. Accordingly, as the designed number of the output bumps (second bumps 124) and the designed number of the input bumps (first bumps 122) of the driving chip 110 do not satisfy both the above-mentioned design rules, dummy bumps can be included in the present invention to balance the distribution of the contact areas of the bumps. The dummy bumps can be bumps that do not have the function of transferring signals. Please refer to FIG. 11 and FIG. 12. The bump distributions of the driving chip 110 in FIG. 11 and FIG. 12 are similar to that in FIG. 9, where the first bumps 122 include a plurality of dummy bumps 146 in FIG. 11 and FIG. 12 so that the total first contacting area A1 of the first bumps 122 can be similar to the total second contacting area A2 of the second bumps 124. The dummy bumps 146 can be disposed in any position. For example, the second row pattern 210 and the second row pattern 212 disposed near the center of the driving chip 110 can be dummy bumps 146 in FIG. 11, while the first row pattern 206 adjacent to the first edge 132 and the first row pattern 208 adjacent to the second edge 134 can be general function bumps 148. In FIG. 12, the dummy bumps 146 and the function bumps 148 can be alternately arranged in the same row.

It deserves to be mentioned that the arrangement of dummy bumps 146 should not be limited to the above embodiments, in which both the first bumps 122 and the second bumps 124 include dummy bumps 146 in FIG. 11 and FIG. 12. In other embodiments, the dummy bumps 146 can only be designed as the first bumps 122 or as the second bumps 124. Taking the application of liquid crystal displays as an example, if the first bumps 122 are the signal-input terminals of the chip, and the second bumps 124 are the signal-output terminals, the dummy bumps 146 are preferably disposed only as the first bumps 122. In addition, relative positions of the dummy bumps 146 to the function bumps 148 can be adjusted according to product designs and demands in other embodiments, and should not be limited to the above embodiments. For instance, the dummy bumps can form the first row pattern adjacent to the first edge, and the second row pattern and/or the third row pattern disposed following the first row pattern and near the center of the chip, besides, the dummy bumps can be optionally disposed outside the two terminals of a certain row consisting of the function bumps, or the dummy bumps can be optionally disposed outside the two terminals of some rows consisting of the function bumps, or the dummy bumps can be disposed between any two function bumps. In case the dummy bumps 146 and the function bumps 148 are alternately arranged, the fine pitches between function bumps 148 can be longer. Thus, occurring probability of short defeats in the output/input terminals can be effectively decreased. As a result, the problem of disproportionate stress distribution can be solved by additional dummy bumps 146 in the present invention, while the integrated circuit design and the interconnection design of the driving chip 110 can be maintained. Moreover, although the bump arrangements in FIG. 11 and FIG. 12 are similar to the bump arrangements in FIG. 3, the dummy bumps can be applied to the other embodiments having the bump arrangements as FIG. 4 through FIG. 8.

Figure 13:
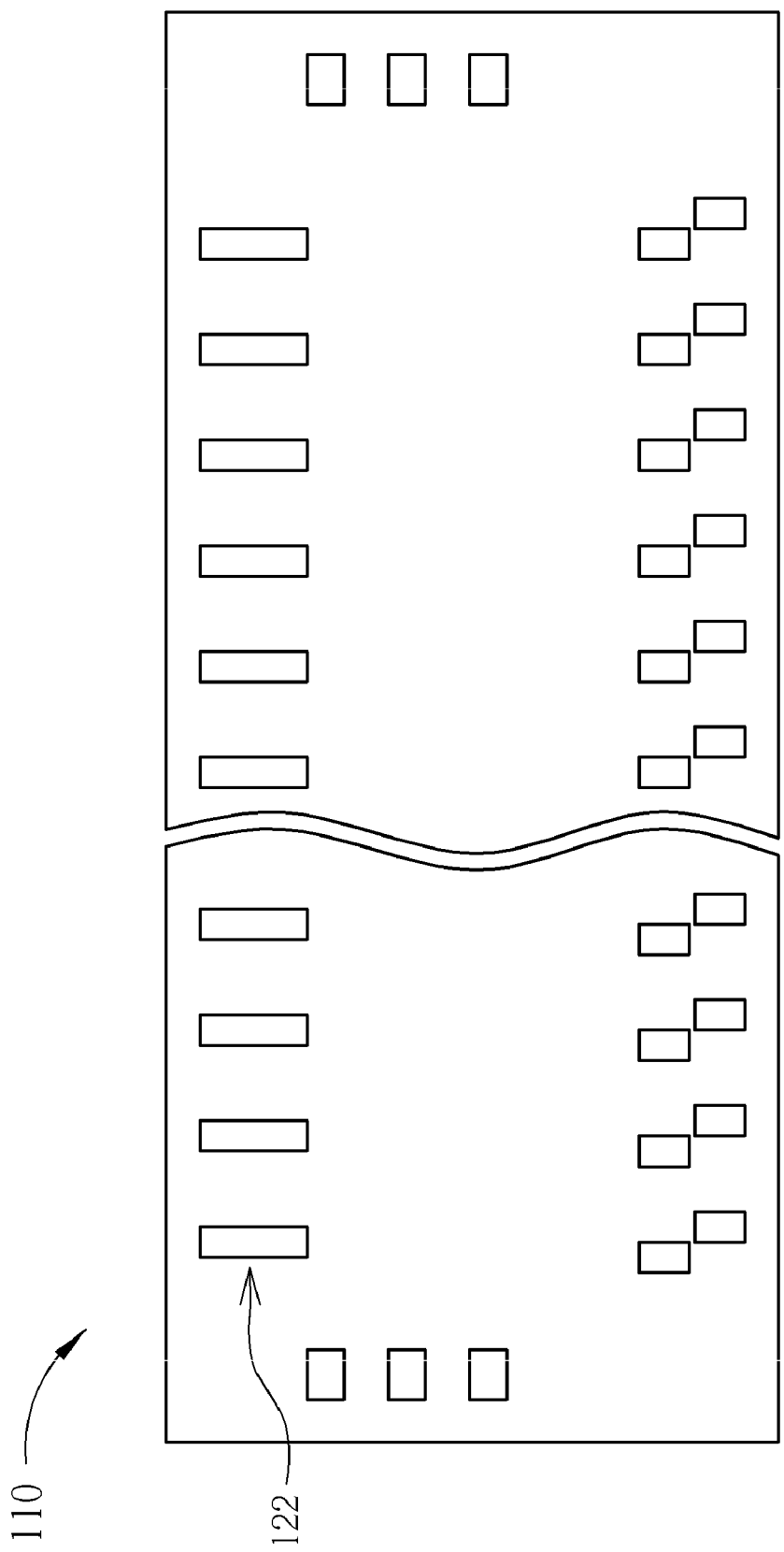

As shown in FIG. 13, the occupied areas of all bumps, or the occupied areas of some bumps can be increased or decreased for balance in the present invention without changing the integrated circuit design or the positions of the outer connecting pads of the driving chip 110. For example, each of the first bumps 122 can be extended toward the centerline of the driving chip 110 in FIG. 13. In other embodiments of the present invention, bumps having various shapes, such as square, rectangular, circular or polygonal, can be adopted for connection. Therefore, the problem of bad indentations occurring in the bumps of the driving chip can be effectively solved according to the above structures of the present inventions for various driving chips. The bump design of the present invention therefore is not limited to the types of the driving chips or to the inner circuit design of the driving chip, so the design flexibility of the bump layout can also be improved.

It should be noted that the non-conductive film 114 is merely one kind of a connection that can be applied to the present invention. Any connecting materials or connecting technologies can be applied to the present invention to connect the driving chip 110 to the glass substrate 104. Because the glass substrate 104 and the driving chip 110 are usually not flexible or elastic, the bump layouts of the present invention are particularly helpful to the NCF process and the COG process to solve the problem of disproportionate connecting stress. It should be understood, however, that the present invention can be applied to other connecting processes, such as ACF processes, tape carrier package (TCP) techniques, chip on film (COF) techniques, flexible printed circuit film (FPC) techniques, wiring on array (WOA) techniques, etc. In practice, any kind of bump structures, such as gold bumps or other bumps having a high coefficient of elasticity, can be adopted to the present invention. In addition to the liquid crystal display, the chip of the present invention can be applied to other apparatuses or external circuits, such as plasma display devices or light emitting diode devices. Furthermore, the above driving chip can be replaced with other semiconductor devices. In other words, the above bump arrangements can be applied to other semiconductor devices, such as semiconductor package structure.

In summary, one of the main characteristics of the present invention is that a ratio of the total contacting area of the bumps near the upper edge to the total contacting area of the bumps near the lower edge is between 0.8 and 1.2, a ratio of the second contacting area of the single second bump to the first contacting area of the single first bump is between 0.25 and 0.5, and the first bumps and the second bumps distinguish are uniformly distributed near the two opposite longer edges. As a result, the connecting stress between the driving chip and the display device can be uniformly distributed. The purpose can be achieved by making the contacting area of the single bump disposed near the upper edge approximately equal to the contacting area of the single bump disposed near the lower edge. The purpose can further be achieved by adjusting the contacting area of the bumps, while the number of the bumps disposed near the upper edge is different from the number of the bumps disposed near the lower edge. Thus, poor contacts between the driving chip and the glass substrate can be avoided in the present invention, and the connecting stability for the driving chip can be increased. Meanwhile, the pattern symmetry of the bump layout is improved to increase the reliability and the design flexibility.

Those skilled in the art will readily observe that numerous modifications and alterations of the device and method may be made while retaining the teachings of the invention.

What is claimed is:

1. A liquid crystal display, comprising:
  a liquid crystal display panel;
  a chip, disposed on the liquid crystal display panel, wherein the chip has a surface with a first edge and a second edge opposite to the first edge, the chip comprising:
    a plurality of first bumps, disposed on the surface of the chip and near the first edge, each of the first bumps having at least one first contacting area, and being connected to the liquid crystal display panel, wherein the first bumps are arranged as a first pattern consisting of a plurality of first oblique lines; and
    a plurality of second bumps, disposed on the surface of the chip and near the second edge, each of the second bumps having at least one second contacting area, and being connected to the liquid crystal display panel, wherein a ratio of a sum of the first contacting areas to a sum of the second contacting areas is between 0.8 and 1.2, and the second bumps are arranged as a second pattern consisting of a plurality of second oblique lines; and a non-conductive film, disposed between the chip and the liquid crystal display panel for connecting the chip and the liquid crystal display panel.

2. The liquid crystal display of claim 1, wherein a ratio of each of the second contacting areas to each of the first contacting areas is between 0.25 and 0.5.

3. The liquid crystal display of claim 1, wherein the chip comprises a central region disposed between the first bumps and the second bumps, the central region has no bumps, and a minimum distance between the first bumps and the second bumps is between 80 percent and 90 percent of a distance between the first edge and the second edge.

4. The liquid crystal display of claim 1, comprising no anisotropic conductive films between the chip and the liquid crystal display panel.

5. The liquid crystal display of claim 1, wherein the ratio of the sum of the first contacting areas to the sum of the second contacting areas is 1.

6. The liquid crystal display of claim 1, wherein the second bumps are arranged in a plurality of rows along a direction of the second edge.

7. The liquid crystal display of claim 6, wherein the second bumps are staggered in the rows.

8. The liquid crystal display of claim 6, wherein the rows of the second bumps comprise a first row pattern adjacent to the second edge, and a second row pattern adjacent to the first row pattern.

9. The liquid crystal display of claim 8, wherein the second bumps forming the first row pattern are fewer than the second bumps forming the second row pattern.

10. The liquid crystal display of claim 8, wherein the second bumps forming the first row pattern are more numerous than the second bumps forming the second row pattern.

11. The liquid crystal display of claim 8, wherein a minimum distance between the first bumps and the first edge is between 0.8 micrometers and 0.15 micrometers, and a minimum distance between the second bumps forming the first row pattern and the second edge is between 0.8 micrometers and 0.15 micrometers.

12. The liquid crystal display of claim 1, wherein the first bumps are arranged in a row along a direction of the first edge.

13. The liquid crystal display of claim 1, wherein the first bumps are arranged in a plurality of rows along a direction of the first edge.

14. The liquid crystal display of claim 1, wherein the surface of the chip is a rectangular surface, and the first edge and the second edge are two longer edges of the rectangular surface.

15. The liquid crystal display of claim 1 further comprising a central region disposed between the first bumps and the second bumps, and the central region having no bumps.

16. The liquid crystal display of claim 1, wherein the first oblique lines are parallel with the second oblique lines.

17. The liquid crystal display of claim 1, wherein an included angle between the first oblique lines and the first edge, and an included angle between the second oblique lines and the second edge is between 60 degrees and 30 degrees.

18. The liquid crystal display of claim 1, wherein the first oblique lines and the second oblique lines are symmetrical with respect to a centerline of the chip.

19. The liquid crystal display of claim 18, wherein an included angle between the first oblique lines and the centerline, and an included angle between the second oblique lines and the centerline is between 60 degrees and 30 degrees.

20. The liquid crystal display of claim 1, wherein the first bumps or the second bumps comprise at least one dummy bump.

* * * * *